US011594402B2

(12) United States Patent
Züger

(10) Patent No.: US 11,594,402 B2
(45) Date of Patent: Feb. 28, 2023

(54) MAGNETRON SPUTTERING SOURCE AND COATING SYSTEM ARRANGEMENT

(71) Applicant: OERLIKON SURFACE SOLUTIONS AG, Pfaffikon, Pfaffikon (CH)

(72) Inventor: Othmar Züger, Triesen (LI)

(73) Assignee: OERLIKON SURFACE SOLUTIONS AG, PFAFFIKON, Pfaffikon (CH)

( * ) Notice: Subject to any disclaimer, the term of this patent is extended or adjusted under 35 U.S.C. 154(b) by 173 days.

(21) Appl. No.: 16/770,271

(22) PCT Filed: Nov. 19, 2018

(86) PCT No.: PCT/EP2018/081799
§ 371 (c)(1),
(2) Date: Jun. 5, 2020

(87) PCT Pub. No.: WO2019/110288
PCT Pub. Date: Jun. 13, 2019

(65) Prior Publication Data
US 2021/0375603 A1    Dec. 2, 2021

Related U.S. Application Data

(60) Provisional application No. 62/594,622, filed on Dec. 5, 2017.

(51) Int. Cl.
*H01J 37/34* (2006.01)
*C23C 14/35* (2006.01)
*C23C 14/50* (2006.01)

(52) U.S. Cl.
CPC ........ *H01J 37/3452* (2013.01); *C23C 14/351* (2013.01); *C23C 14/505* (2013.01);
(Continued)

(58) Field of Classification Search
CPC .............. H01J 37/3452; H01J 37/3405; H01J 37/3423; H01J 37/347; H01J 37/345; C23C 14/505; C23C 14/351
(Continued)

(56) References Cited

U.S. PATENT DOCUMENTS 4,200,510 A * 4/1980 O'Connell .......... H01J 37/3408
204/192.12
4,818,358 A 4/1989 Hubert et al.
(Continued)

FOREIGN PATENT DOCUMENTS

CN    1297575 A    5/2001
CN    101203935 A    6/2008
(Continued)

OTHER PUBLICATIONS

International Search Report of PCT Application No. PCT/EP2018/081799, dated Feb. 15, 2019.
(Continued)

*Primary Examiner* — Jennifer Wecker
*Assistant Examiner* — Patrick S Ott
(74) *Attorney, Agent, or Firm* — Pearl Cohen Zedek Latzer Baratz LLP

(57) ABSTRACT

Magnetron sputtering source (1) for coating of a substrate (2), the sputtering source (1) comprising: a target (5) having a target surface at a front side a magnetron arrangement (511, 512) at a backside of the target (5) for creating a magnetic field near the target surface, to define a loop shaped erosion zone (20) at the target surface between an inner magnet assembly (512) and an outer magnet assembly (511), wherein the erosion zone (20) comprises a middle section with two parallel tracks (26) having a distance (d) and two curved end loop sections (27) each of which connects adjoining ends of the parallel tracks (26) and has a loop
(Continued)

width (w) in the direction of the distance (d) which is greater than the distance (d) resulting in a double-T-shaped primary geometry of the erosion zone to provide an increased coating material flux from the end loop sections (27) to the substrate.

10 Claims, 10 Drawing Sheets

(52) U.S. Cl.
CPC ........ *H01J 37/3405* (2013.01); *H01J 37/347* (2013.01); *H01J 37/3423* (2013.01)

(58) Field of Classification Search
USPC .......................................... 204/298.19, 298.2
See application file for complete search history.

(56) References Cited

U.S. PATENT DOCUMENTS

| | | | |
|---|---|---|---|
| 4,826,514 A | | 5/1989 | Griffis et al. |
| 4,826,584 A | | 6/1989 | Dos Santos Pereiro Ribeiro |
| 5,262,028 A | | 11/1993 | Manley |
| 6,375,814 B1 | * | 4/2002 | De Bosscher ...... H01J 37/3405 |
| | | | 204/298.22 |
| 2006/0219550 A1 | * | 10/2006 | Deppisch ............ H01J 37/3408 |
| | | | 204/298.16 |
| 2008/0190765 A1 | | 8/2008 | Lopp et al. |
| 2011/0180401 A1 | * | 7/2011 | Endo ....................... C23C 14/35 |
| | | | 204/298.08 |
| 2018/0023189 A1 | * | 1/2018 | Kuriyama ........... C23C 14/3457 |
| | | | 204/298.2 |

FOREIGN PATENT DOCUMENTS

| | | | |
|---|---|---|---|
| CN | 102037154 A | | 4/2011 |
| CN | 107151784 A | | 9/2017 |
| EP | 0 242 826 A2 | | 10/1987 |
| EP | 0297235 A1 | | 1/1989 |
| EP | 1553207 A2 | | 7/2005 |
| EP | 1 710 829 A1 | | 10/2006 |
| JP | S55-128580 A | | 10/1980 |
| JP | S63 317671 A | | 12/1988 |
| JP | 2002-512311 A | | 4/1999 |
| JP | 2001-348663 A | | 12/2001 |
| JP | 2006-291357 A | | 10/2006 |
| WO | WO 99/54911 A1 | | 10/1999 |
| WO | WO 2016/148058 A1 | | 9/2016 |
| WO | WO-2018068833 A1 | * | 4/2018 ............. C23C 14/35 |

OTHER PUBLICATIONS

Office Action from Japanese Patent Application No. 2020-530554 dated Dec. 9, 2022.
Office Action for Chinese Patent Application No. 201880086676.3, dated Dec. 8, 2022.

* cited by examiner

Figure 1 (SdT)
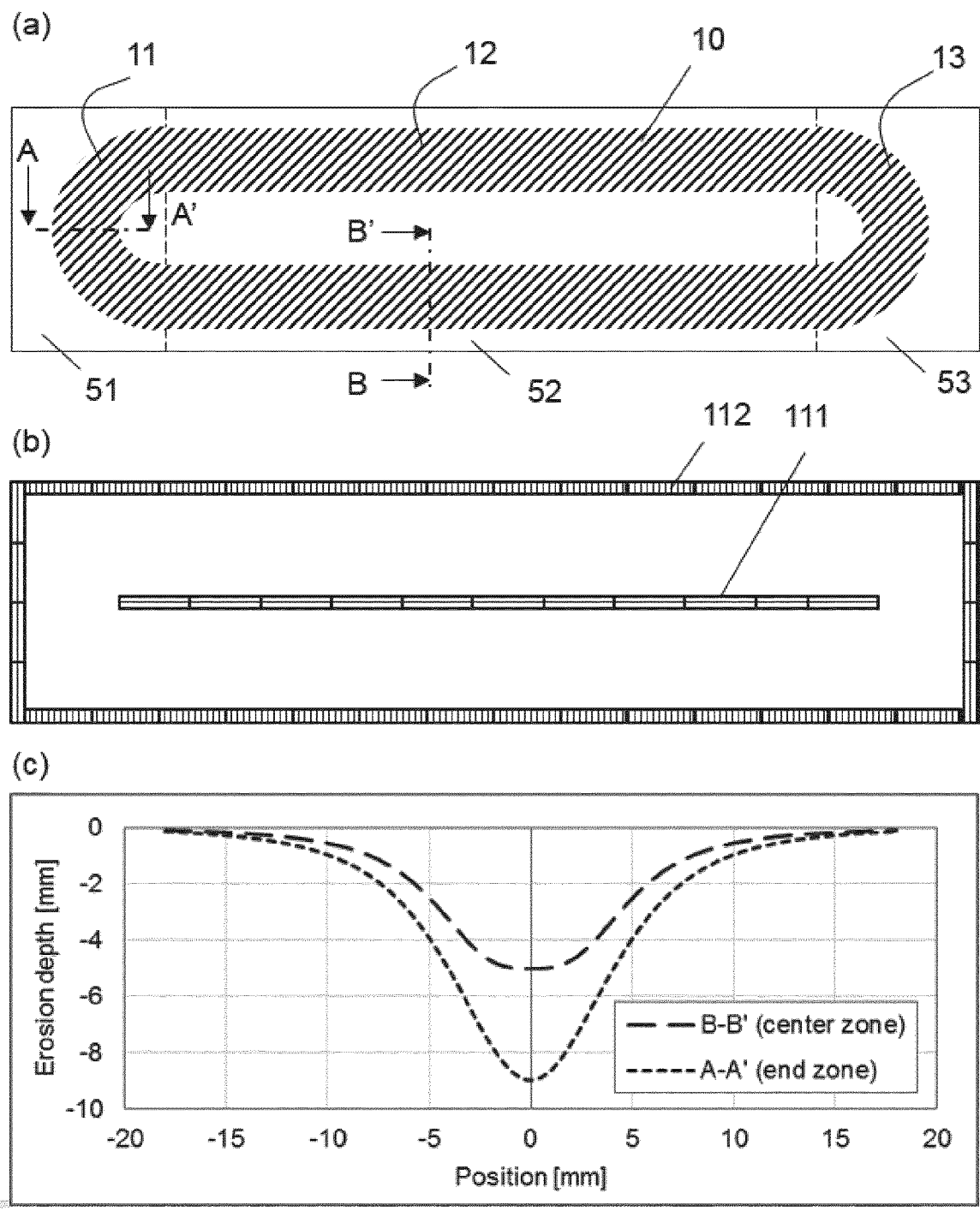

Figure 2 (SdT)
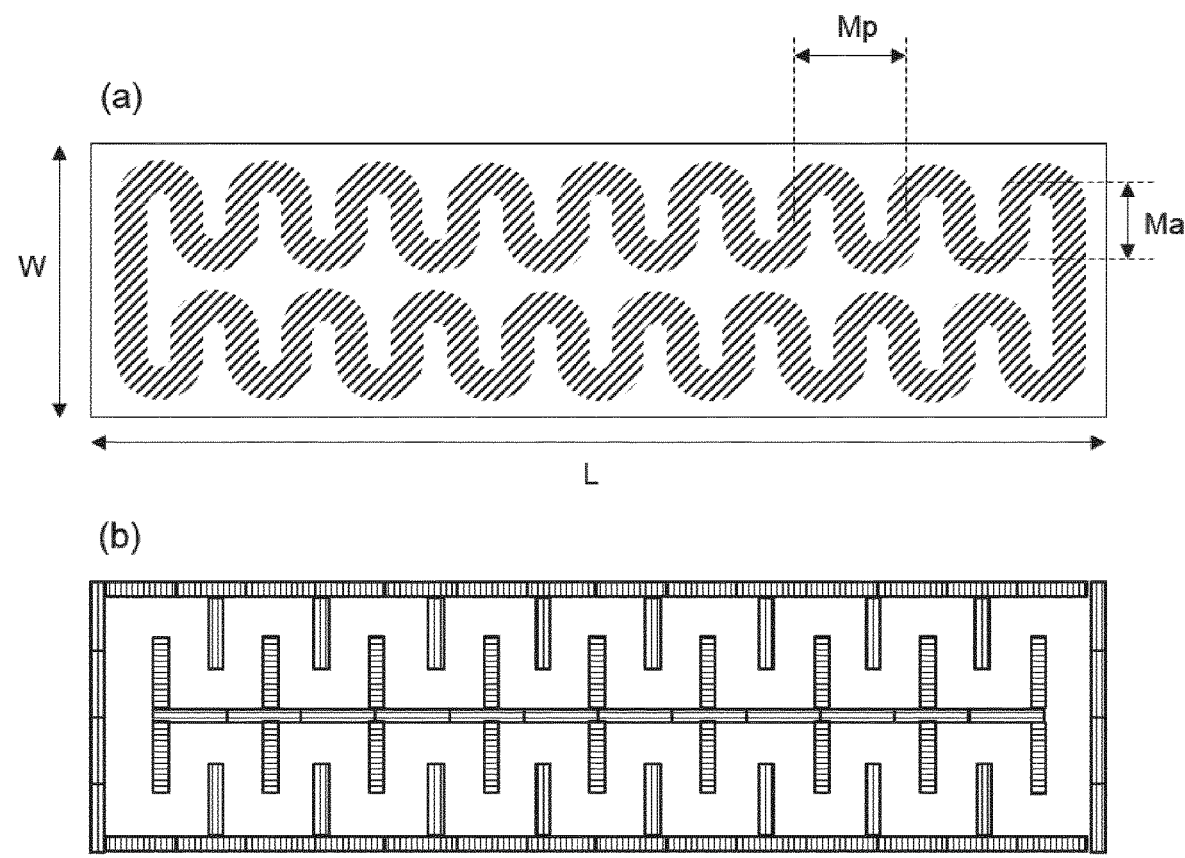

Figure 3 (SdT)
(a)
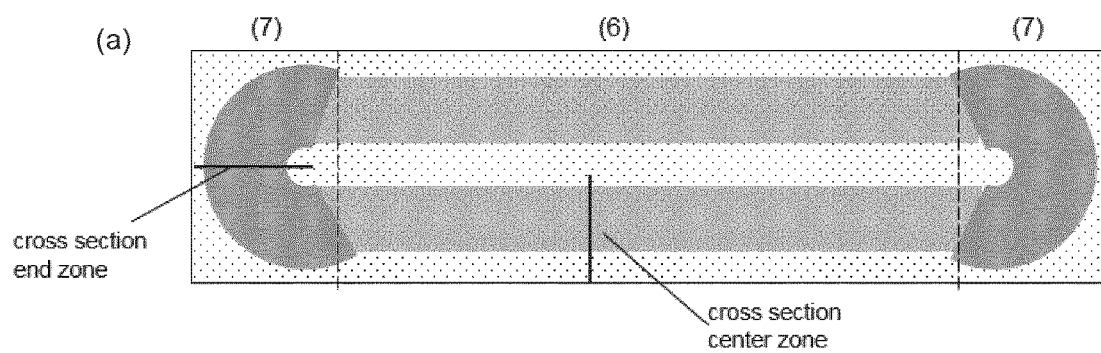
cross section end zone
cross section center zone
(b)
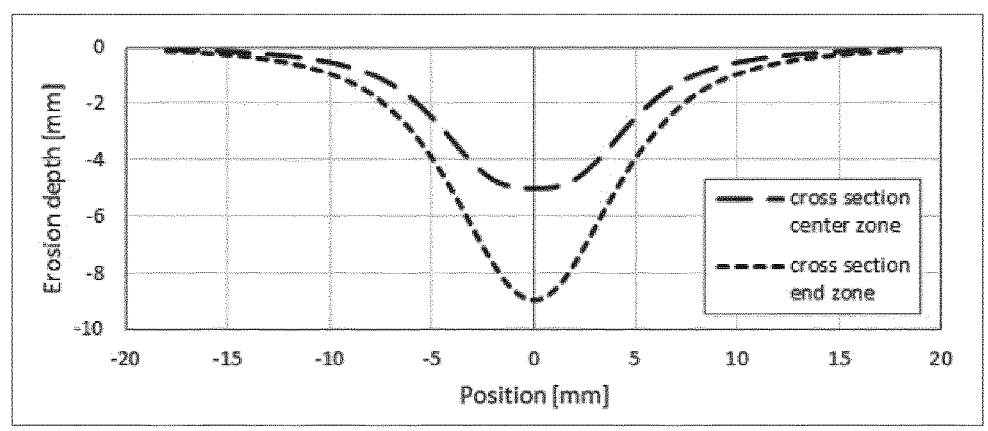

Figure 4 (SdT)
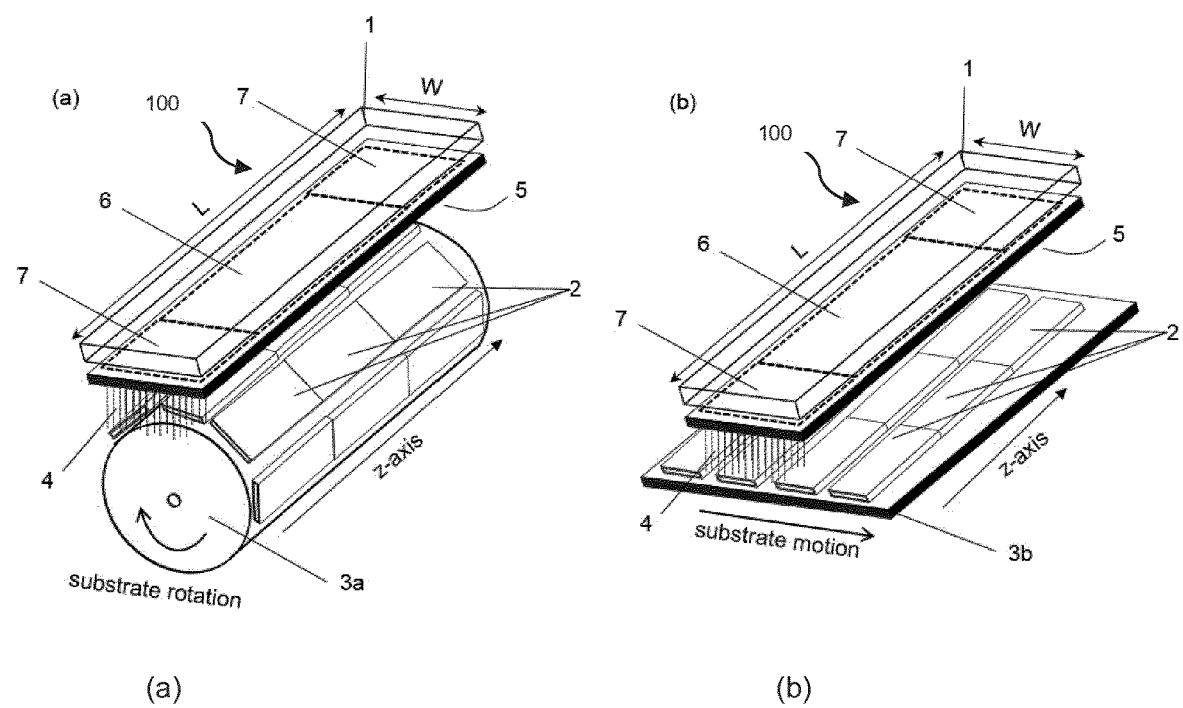
(a) (b)

MAGNETRON SPUTTERING SOURCE AND COATING SYSTEM ARRANGEMENT

CROSS-REFERENCE TO RELATED APPLICATIONS

This application is a National Phase Application of PCT International Application No. PCT/EP2018/081799, International Filing Date Nov. 19, 2018, claiming benefit of U.S. Patent Application No. 62/594,622, filed Dec. 5, 2017, which is hereby incorporated by reference.

FIELD OF THE INVENTION

The present invention relates to a new magnetron sputtering source design for achieving an improved coating thickness uniformity and specifically maintaining a low drift in coating uniformity over the utilization time of the target. The present invention also relates to a coating system arrangement comprising such a magnetron sputtering source.

During a sputtering process, the generation of gas ions in a glow discharge plasma is caused by collisions of gas atoms with electrons. The application of a sufficiently high negative voltage at the target sustains the glow discharge plasma in front of the target and causes the acceleration of positively charged gas species, e.g. Argon ions, to the target surface with high energy. This ion bombardment causes the knock-off or sputtering of the target material and thus a transformation of solid target material into a vapor phase.

For coating substrates of large linear dimension or where many small substrates but of high number have to be coated simultaneously, the use of rectangular targets is best suited. In the field of physical vapor deposition (PVD) or plasma-assisted chemical vapor deposition (PECVD or PECVD) rectangular sputtering cathodes are used in order to deposit thin coating films on substrates. In case of magnetron sputtering, a magnetic field is created in the vicinity of the target surface in order to guide and "concentrate" plasma electrons near the target surface, which results in local enhancement of ionization of process gas. The flux of the ions onto the target surface, accelerated by the electric field in the sheath of the plasma, causes the erosion of the target material. The degree of electrons being localized on the target surface region depends on the local strength of the magnetic field and its direction. The erosion zones on the target surface are localized in regions where the magnetic field lines are parallel or nearly parallel to the target surface. The magnetic field is arranged in such a way that the erosion zone form a connected shape on the target surface, which is often referred to as "erosion racetrack" or just "racetrack". This is schematically shown in FIG. 1a In the context of the present application the target surface being exposed to the plasma during sputtering is referred to as second surface or front side, while the opposite target surface which is directed towards a magnet system is referred as first surface or backside. The magnetic field on the second target surface usually results from a flat magnet system of rectangular shaped permanent magnets, which are arranged on the backside, thus the first surface of the target. In the simplest case, such a magnet system comprises an inner magnet assembly 111 which can have more than one permanent magnet with a first pole oriented towards the first surface, and an outer magnet assembly 112 with a second pole oriented towards the first surface of the target. If the first pole is the north pole the second pole is the south pole. If the first pole is the south pole the second pole is the north pole.

Such a typical magnet system is depicted schematically in FIG. 1b and results in the creation of a magnetic field from the at least one permanent magnet with a first pole and the at least one permanent magnet with a second pole. The regions on the second surface of the target where the field lines are parallel or nearly parallel to the second surface form a connected pattern acting as a magnetic field tunnel where plasma electrons are trapped in a drift current in vicinity of the target surface. In such an arrangement of magnets, the racetrack or erosion zone 10 on the target surface has the typical shape of the projection of such a magnetic field tunnel onto the second target surface.

FIG. 1c shows the typical crosscut of an erosion trench.

FIG. 4 below shows a typical arrangement of a known coating system. Parts to be coated (substrates 2) are passing the sputtering source 1 perpendicular to its length dimension. Uniformity problems of the coating arise because of the limited length of the sputtering source target 5: the coating thickness on parts passing the sputtering source in regions at both ends of the rectangular sputtering source is smaller as compared to parts passing the source more centrally.

A common method to improve the coating thickness uniformity, sometimes stronger or larger magnets are used at the ends of the sputtering source in order to enhance the magnetic field at the target surface, causing a stronger erosion and consequently resulting in a denser vapor flux. However due to the magnetic field enhancement in these regions, an enhanced sputtering erosion of the target takes place in the end zone of the target. This effect causes different erosion profiles along the straight parts and the bent end zones of the target The utilization of the target is determined by the region with maximum depth of the racetrack. The target can only be used as long this maximum depth is less than the material thickness of the target.

In order to enhance the utilization of rectangular targets, there are some methods reported to enlarge the width of the erosion zone of magnetron sputter sources, e.g. by sophisticated magnet assemblies behind the target.

EP297235A1 discloses an approach to enhance the uniformity of the coating thickness on planar substrates by broadening the racetrack of the opposing rectangular target. To achieve this effect, a second plate is used in EP297235A1 exhibiting rows of bar-shaped magnets, at the backside of the target, where all individual magnets have the same polarity and are aligned with an offset lengthwise. Additionally EP297235A1 requires that the magnets of a first row are disposed offset laterally and lengthwise from the magnets of adjacent rows so that the magnets of adjacent rows are not at the same "height" position in length direction of target length.

EP242826A2 discloses a backing plate for rectangular targets, which exhibits a magnet assembly with inner and outer poles that oppose each other and whereby the inner magnet is bar-shaped and elongated along the center-line of the target/backing plate and exhibits equally spaced tongues that extend outwardly at right angles from said central bar. The corresponding outer magnet is shaped to oppose the inner magnet at equal distance, resulting in magnetic field lines tunneling through the rectangular target in order to create a corresponding meander shaped erosion zone on the target. EP242826A2 mentions that by broadening the erosion zone from an oval shape to the meander-shape, the utilization of the target material and the sputtering yield can be substantially enhanced in the center portion 6 of the target.

An exemplary racetrack with corresponding magnet assembly is depicted in FIG. 2b below. The distance between adjacent magnets of same polarity perpendicular to length direction of the target determines the distance of the resulting meander lines of the racetrack on the target surface and is referred as meander period, Mp, in the FIG. 2a. It can be seen that the extension of the bent racetrack parts orthogonal to the target length can be expressed by the meander amplitude, Ma.

JP2001348663A proposes to enhance the sputtering efficiency of rectangular cathodes by broadening the racetrack on the cathode surface via increase of the curvilinear portions of the magnet arrangement on the backside of the target, akin to EP242826A2. The inner and outer magnet pairs are thereby coupled via a magnet yoke. Although JP201348663A mentions that forming magnetic circuits by meander-, zig-zag-, or comb-shaped magnet arrangements on the backside of the target, which enhances the sputtering yield in lateral and length direction of the rectangular target.

EP1553207A2 discloses a magnetron for use at the backside of a rectangular target, having an inner pole with a first magnetic polarity and an outer pole with opposite magnetic polarity as the first pole. EP1553207A2 presents several examples of geometric assemblies for the opposing magnetic poles which cover e.g. arrangements of the magnetrons as serpentines or spirals, which is explained to distribute the plasma over a wider target area. EP1553207A2 further discloses a lateral scanning method to cyclically move the magnetic field pattern on the backside of the rectangular target to improve homogeneity of the target erosion area. This approach requires significant effort to enable the mechanical movement and liquid cooling of the target, as well as considerably larger dimensions of the whole sputter source and magnetron assembly compared to other approaches.

In state-of-the-art magnetron sputtering sources, where the elongation of the magnetron assembly is essentially of the same length as the rectangular target, general focus is put on increasing the racetrack zone of the target in lateral, or width direction, of the target.

The continuous demand for higher coating thickness homogeneity over the length of such magnetron cathodes is however difficult to achieve, especially over the whole utilization or lifetime of a target, and accompanied by the need for reliable, economic and mass production capable deposition equipment. In order to achieve uniform coatings on substrates arranged extending in the direction of the length of a rectangular sputtering source, with the substrates passing the source perpendicular to the length of the source, an enhanced flux of coating material vapor has to be generated in both end zones on the length of the source.

FIG. 4 depicts a general setup of a magnetron sputter source 1, exhibiting a target 5 and a magnetron assembly at the backside of the target with both essentially the same dimensions in length, L, and width, W, direction of the target. The target 5 opposes one or more substrates 2, which are either attached to a rotating spindle 3a by which the substrates 2 are repetitively passed through the coating vapor 4 in front of the target 5. Alternatively, FIG. 4b depicts the situation of a linear motion of the substrates 2 passing by in front of the target 5 either once or numerous times in a reciprocating manner.

The cooling means of the target, commonly arranged between target and magnet array, as well as optional backing plates of a target are not in the focus of the present invention but known by the person skilled in the art and thus not further discussed in detail.

With a standard magnetron arrangement 111, 112 (see FIG. 1b) without any means to improve the uniformity of the coating the resulting coating thickness on the substrates passing by the source reaches its maximum at the center position in length direction of the sputtering source and a drop-off is observed at the substrate positions towards both ends of the sputtering source. This situation is exemplarily shown in FIG. 6 continuous line (Standard).

Obviously, in most applications, uniform coating thickness is desired over a wide range in the direction of the length of sputtering source. This means the deviations of the coating thickness from the average coating thickness should not exceed a certain value over the surfaces to be coated. A better coating thickness uniformity represents either an improved quality measure for the coated parts, or it can beneficially be used for extending the usable length where parts can be coated with a standard uniformity. Both ways result in an economic benefit for the user of the coating system. A further important factor is a homogenous erosion depth of the racetrack on the target. Since the utilization or lifetime of the target is determined by the location where the erosion in the racetrack is deepest, the total utilization of the target material is improved with any means to achieve a better uniformity of the erosion over the entire racetrack across the target. This is important especially in the case of expensive target materials, or with volume production coating systems which demand long lasting targets.

The invention's main essence is providing a means to achieve both uniform coating on the surfaces of the parts to be coated, and uniform erosion depth over the entire racetrack on the target.

In order to achieve an improved coating thickness uniformity there exist several known possibilities:

a) Size of the sputtering source:

The size of the sputtering source could be made substantially larger (e.g. longer in target length direction) than the length of the range where substrates can be coated. This approach however is increasing the size of the whole deposition equipment considerably and reduces the utilization of the coating vapor since a larger fraction of the coating vapor is deposited in areas beyond the substrates and is therefore lost.

b) Use of permanent magnets with different strength:

Alternatively, stronger magnets (different types or denser arrangement) can be used for the end zones 7 of the sputtering source, generating stronger magnetic fields on the surface of the sputtering target in these end zones compared to the center zone 6. This results in an enhanced erosion rate and a larger coating material flux from these end zones compared to the center zone. In this way, the drop-off of the coating thickness on substrates passing the sputtering source near the end zones 7 could be reduced, resulting in an improved uniformity on the substrates to be coated. However, this approach has a considerable drawback, since the net utilization of the target material is reduced, because the utilization or lifetime of the target is determined by the racetrack region with deepest erosion. Once a maximum erosion depth is reached, the target must be considered as used up. For target material bonded on a backing plate (most often made of copper for good cooling efficiency), the target is used up once the erosion at the location with the highest erosion rate reaches the thickness of the target material bonded to the backing plate. For full targets (for mechanical stability reasons limited to metals), the targets must be considered as used up, when the remaining thickness of target material reaches a certain minimum ensuring still mechanical stability against pressure from the cooling liquid flowing on the backside of the target. Again, the criterion on minimum target material thickness applies to the location with the highest erosion rate.

The erosion rates and their distributions on the target surface strongly depend on target material, process gas pressure, target composition, and local magnetic field among other parameters. The optimum parameters for uniform coating thickness can thus be different for different processes and coating materials. In general, for magnetron sputtering cathodes with reasonably improved uniformities over its length, erosion rates at localized positions in the end zones can be more than 30% up to 100% larger than in the straight center zones, leaving an accordingly deeper and sometimes even narrower erosion depth profile on the target end zones compared to the center zone (see for comparison FIG. 1c). For this reason, targets must be replaced when the erosion depth on most of the target is still much lower than the maximum acceptable depth. As a result, the sputtering target must be changed more often, causing more frequent maintenance efforts to change targets resulting in reduced productivity for industrial applications. Moreover, the replacement of unused high purity and for this reason usually rather expensive target material is of economic importance. In cases of expensive materials, recycling of used targets might be economically viable, however is always tied to additional costs. One way of effectively improving utilizations of target material consists in making the target material thicker in the end zones, in order to compensate for the larger erosion in these zones. With this approach, both the utilization time of the target and the overall target material utilization could be increased.

However, there is an additional undesired side effect with enhancing the erosion rate in end zones by increasing the magnetic field strength. The localized erosion rate changes with the depth of the erosion into the target. On the one hand, the magnetic field strength gets stronger in the erosion zones with increasing depth of the erosion racetrack, since the magnetic fields from the permanent magnets behind the target falls off with distance from the magnets. With the erosion getting deeper into the target, the increasing magnetic field results in a denser plasma, which has the effect of a localized increase in the erosion rates at these zones. On the other hand, the width of the magnetic field lines being essentially parallel to the target surface decreases with depth of the erosion racetrack, narrowing down the erosion width in the racetrack, having a negative effect on the effective coating material vapor flux from the racetrack. Overall, from changing erosion rates in the end zones compared to the center zones, the uniformity on parts to be coated being optimized for a new target is drifting off the optimized level with increasing erosion depth of the target, i.e. over utilization time of the target. Therefore, a magnetron configuration optimized for a new target cannot deliver stable and reliable deposition conditions over production time. Other effects like geometric shape of the erosion channels into the target causing narrowing of the material vapor flux from these zones which makes another contribution to a drifting uniformity over the utilization time of the target.

Therefore an object of the present invention is to provide a magnetron sputter source, which allows to overcome above mentioned limitations but still with enhancing the coating thickness homogeneity over the length of a rectangular target. The objective of this invention is a new magnetron sputtering source design for achieving an improved coating thickness uniformity and specifically maintaining a low drift in uniformity over the utilization timespan of the target.

SUMMARY OF THE INVENTION

According to a first aspect of the present invention a magnetron sputtering source for coating of a substrate is provided, wherein the sputtering source comprises: a target having a target surface at a front side (second surface); a magnetron arrangement at a backside (first surface) of the target for creating a magnetic field near the target surface, to define a loop shaped erosion zone at the target (the second) surface between an inner magnet assembly and an outer magnet assembly, wherein the erosion zone comprises a middle section with two parallel tracks having a distance (d) and two curved end loop sections each of which connects adjoining ends of the parallel tracks and has a loop width (w) in the direction of the distance (d) which is greater than the direction (d) to provide an increased coating material flux from the end loop sections to the substrate.

Specifically widening up the racetrack channel in the end zones in the curved parts of the racetrack in order to achieve a more stable uniformity over the utilization timespan of the target is therefore a demanding task. Especially in view of the fact that this effort has to be made for more than one target material, since the erosion channel formation differs to a certain extend for different target materials and sputtering processes with different process gas pressures and compositions.

The inventor found that for stability of the coating thickness uniformity over the utilization timespan, it would be highly desirable to increasing the effective coating material flux from the end zones 7 of a rectangular target, while maintaining approximately the same local erosion rates in the racetrack over the entire target length, L.

The present invention thus proposes a magnetron design for rectangular targets, which enables for:
  essentially the same overall dimensions of the target and the magnetron assembly behind the target in length and width direction of the target,
  an improved coating thickness uniformity measured along the length of the target compared to magnetrons for rectangular targets with simple permanent magnet arrays,
  an improved and stable coating thickness homogeneity over the utilization or lifetime of the target,
  an improved uniformity of the erosion depth in the racetrack on the target surface over the entire length and width of the target, especially also in both end zones of the target,
  low-cost magnetron design due to the use of permanent magnets of equal strength,
  the possibility to modify existing magnetron sputter sources with the new magnetron design in order to achieve above mentioned goals.

The main idea is extending the width of the erosion zones in the end zone of the target compared to the center zone in the essentially same direction on the target as the direction of the motion of the substrates passing the sputtering source. In this way, the necessary effective coating material flux onto the substrate in these end zones is increased without locally increasing the erosion rate on the target. To achieve this, the permanent magnet arrangement of the magnetron has to be widened in these end zones to cover the extended width at these zones, without necessarily enhancing the strength magnetic field in these zones, e.g. by using more or stronger permanent magnets. The shape of the material target may by adapted to a "double T-shape", with two wider parts covering the end zones and a narrower center part.

A second aspect of the present invention relates to a coating system arrangement comprising such a magnetron sputtering source.

BRIEF DESCRIPTION OF THE DRAWINGS

The inventive magnetron will be explained in the following in more detail and several examples and embodiments of the invention are provided for illustration in the accompanying drawing in which:

FIG. 1 shows a known magnetron sputtering zone (racetrack) the corresponding magnetron arrangement (b) and the corresponding erosion depth (c);

FIG. 2 shows another known magnetron sputtering source with an erosion zone (a) and the corresponding magnetron arrangement (b);

FIG. 3 shows a known erosion zone geometry (a) and the corresponding erosion depth (b);

FIG. 4 shows a known coating system with a rotational substrate arrangement (a) and a planar substrate arrangement (b);

DETAILED DESCRIPTION OF THE INVENTION

Figure 5:
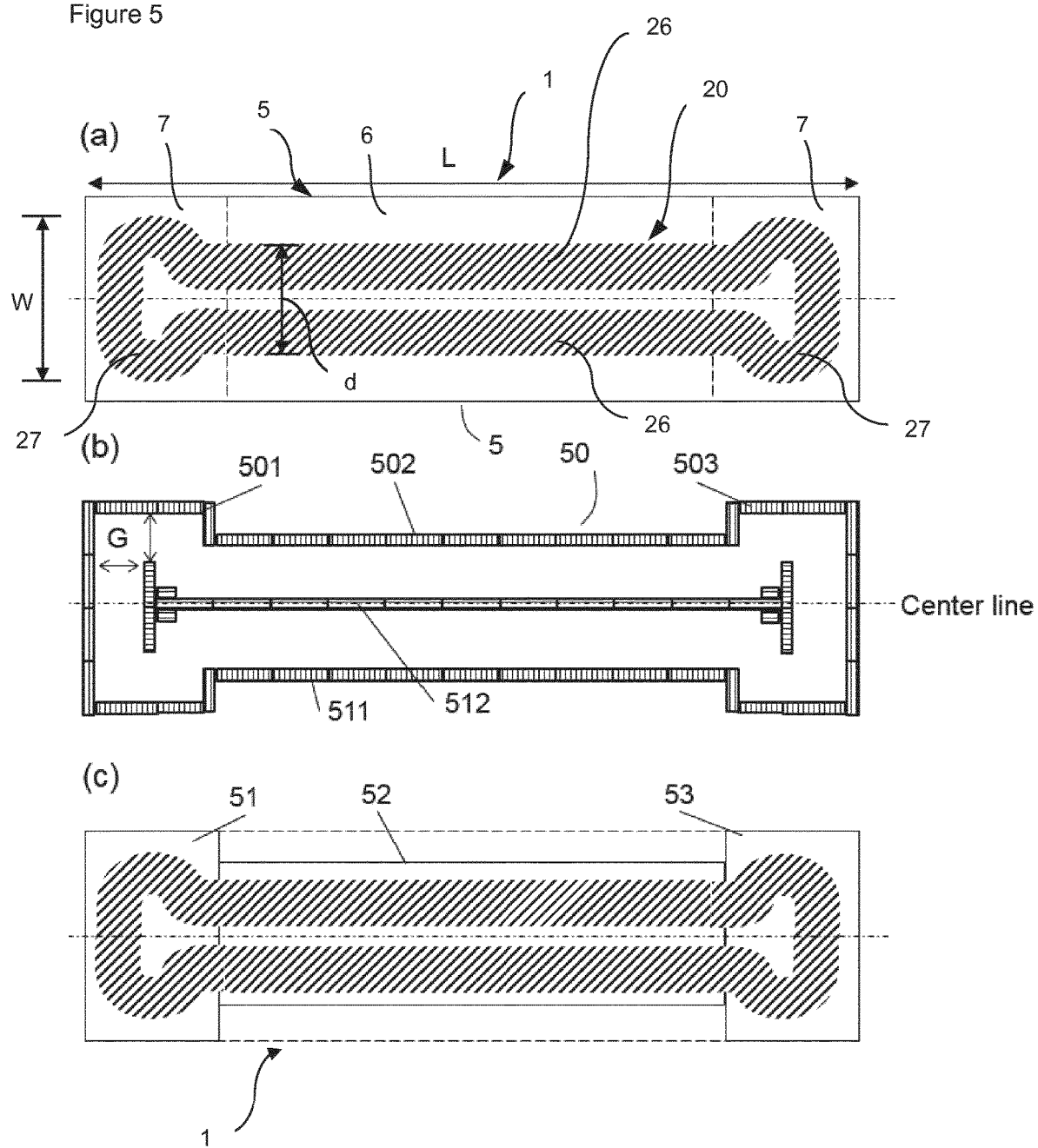
FIG. 5 shows a first embodiment of a magnetron sputtering source according to the present invention including an erosion zone (a); a corresponding magnetron arrangement (b); a erosion zone which is shown on a different target arrangement (c)
Figure 6:
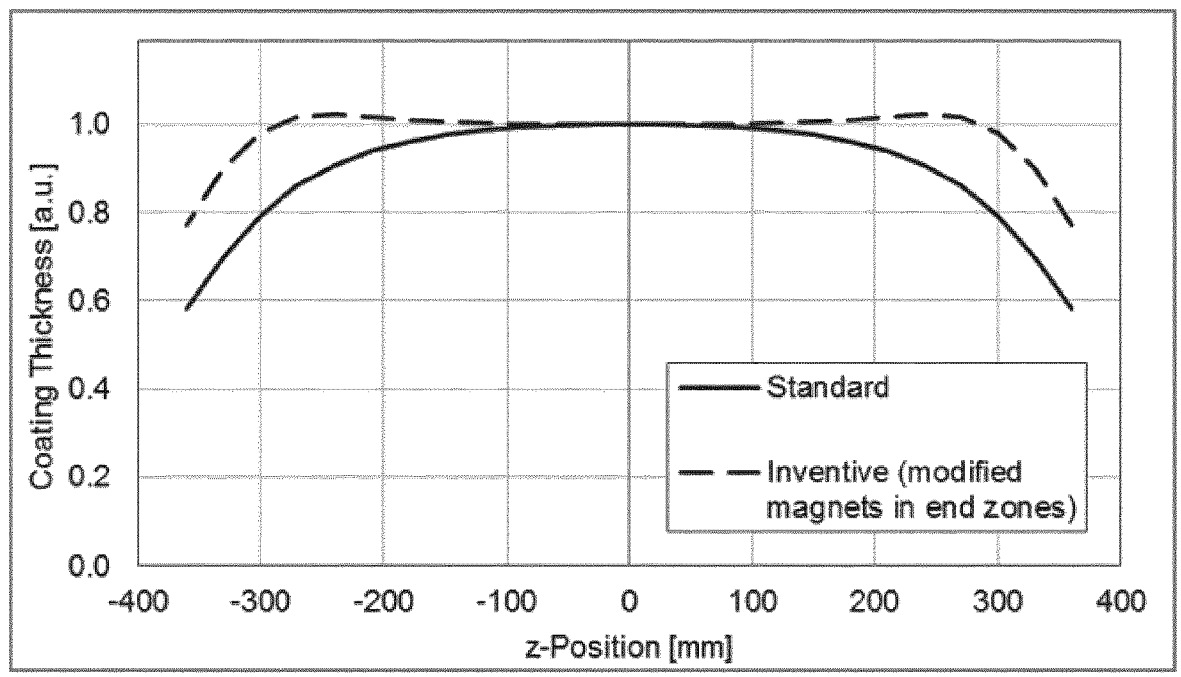
FIG. 6 shows a coating thickness diagram of a coated substrate.
Figure 7:
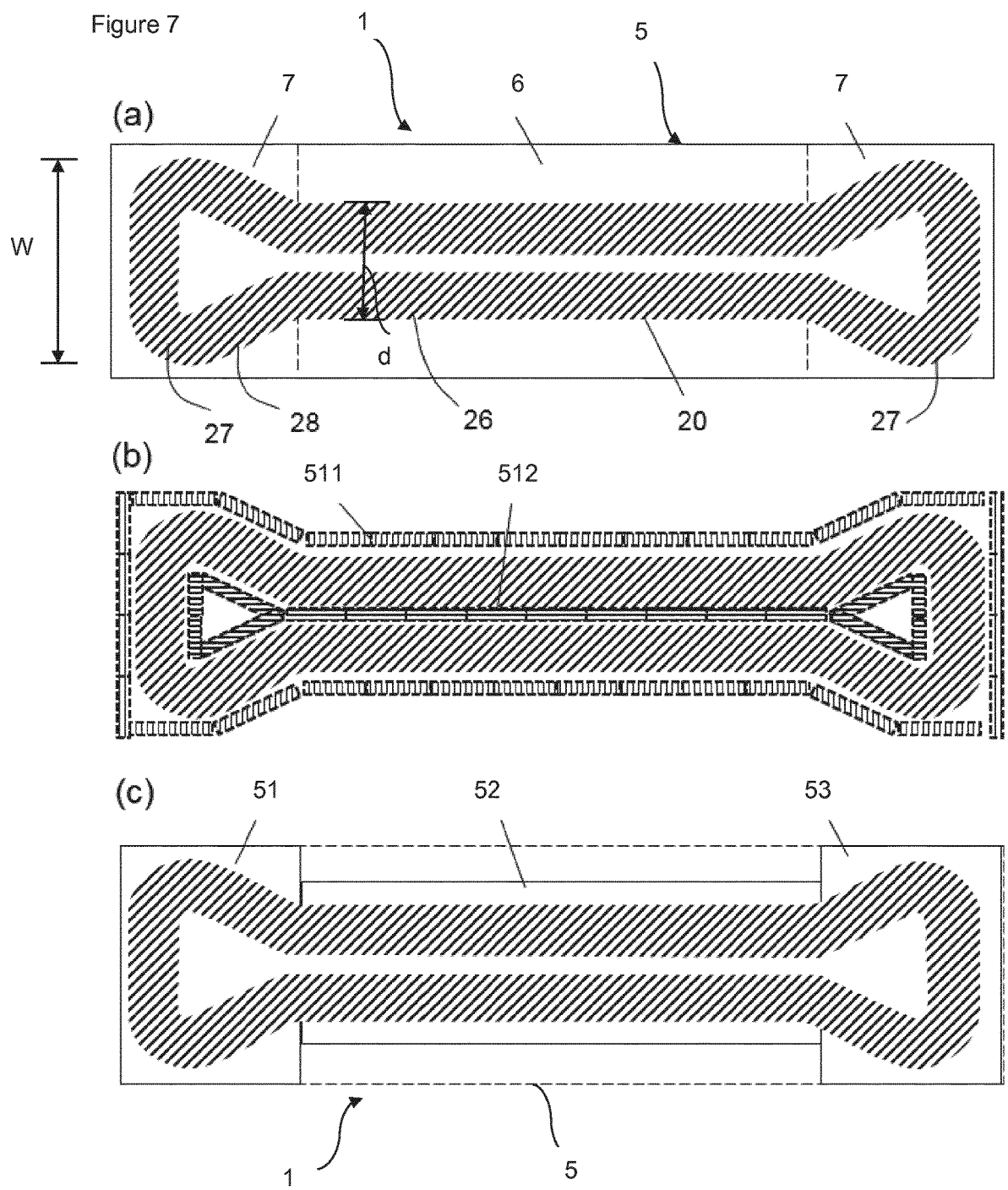
FIG. 7 a second embodiment of an inventive magnetron sputtering source including an erosion zone (a); a corresponding magnetron arrangement (b) and an erosion zone shown on an alternative target (c)
Figure 8:
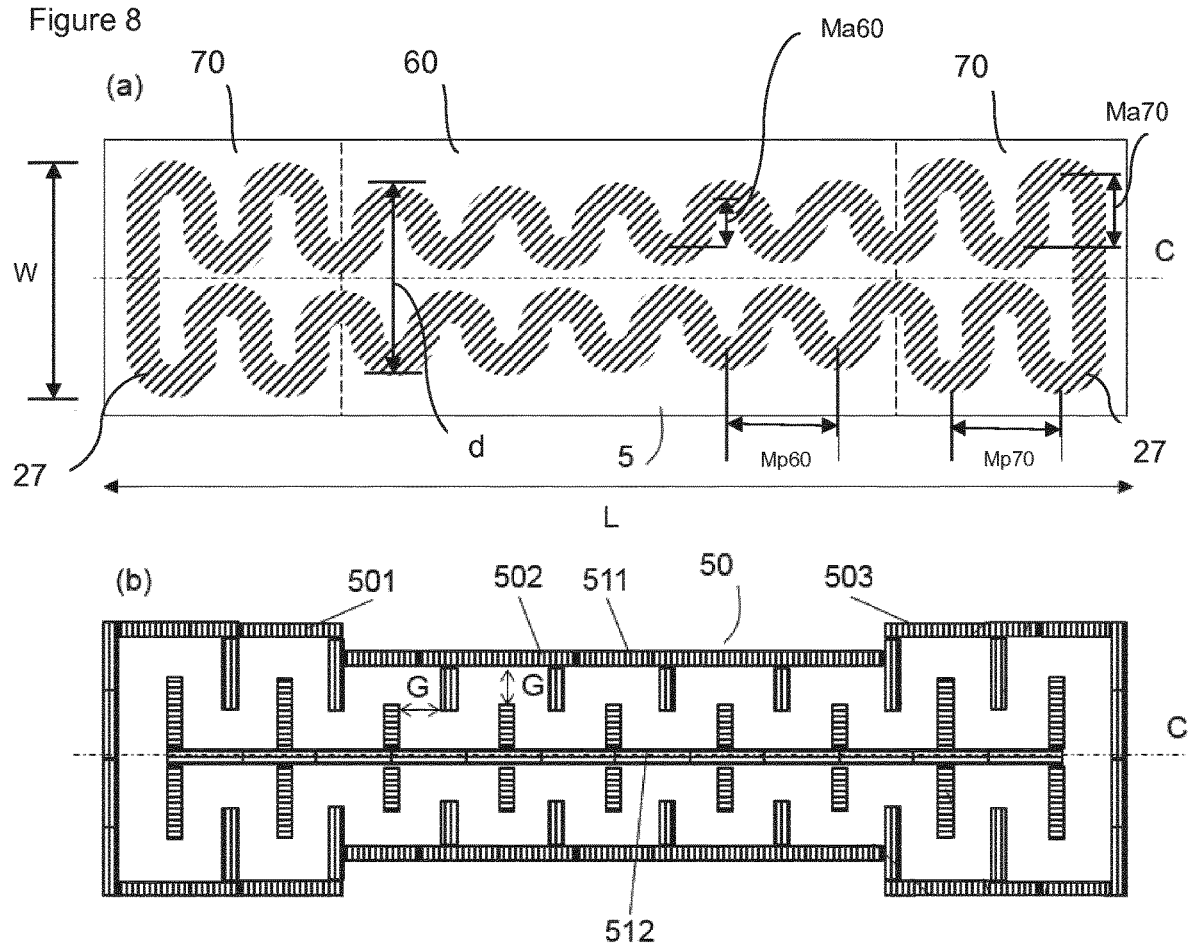
FIG. 8 shows a third embodiment of an inventive magnetron sputtering source showing a meander-type erosion zone geometry (a) and a corresponding magnetron arrangement (d)
Figure 9:
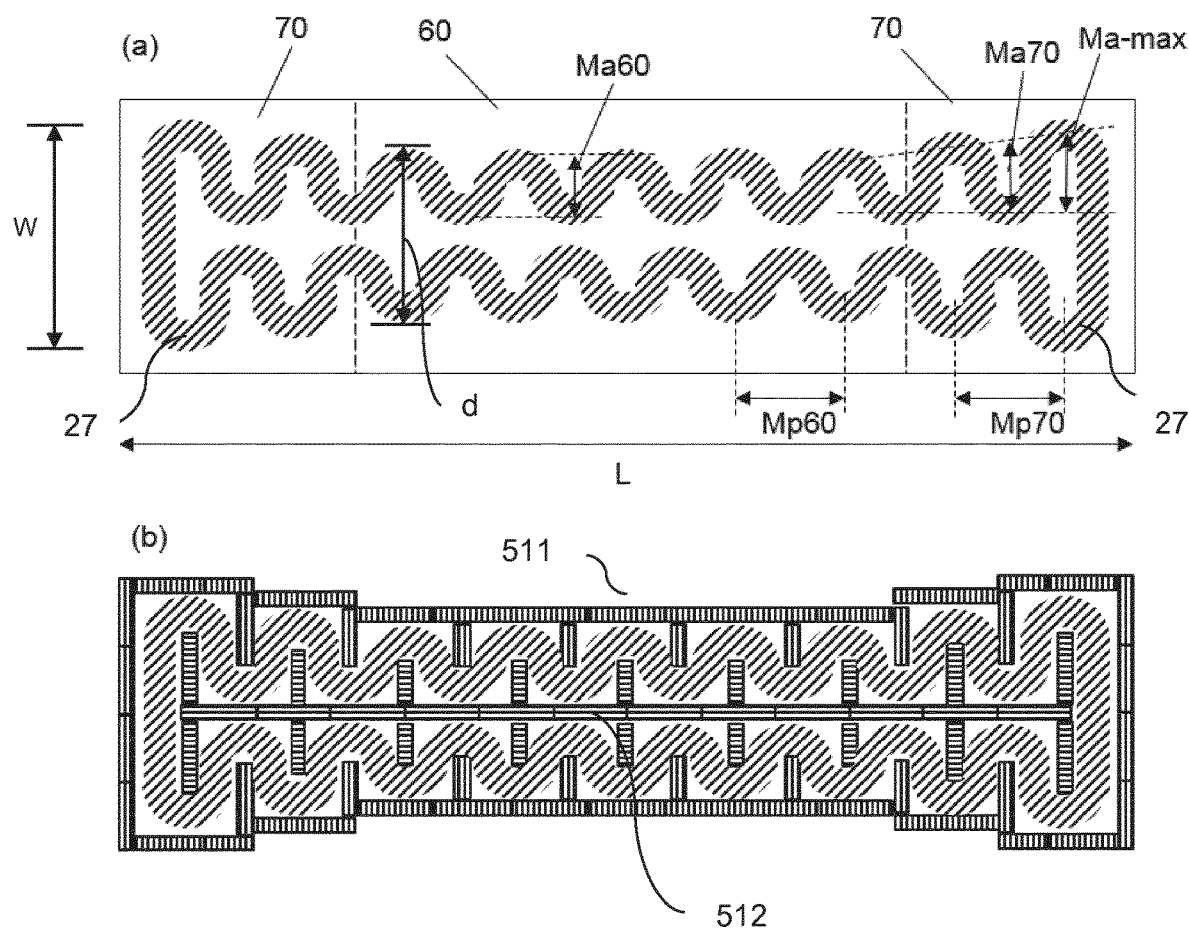
FIG. 9 shows a fourth embodiment of an inventive magnetron sputtering source including a different meander-type erosion zone (a) and a corresponding magnetron arrangement (b) and FIG. 10 shows a fifth embodiment of an inventive magnetron sputtering source including a further different erosion zone (a) and a corresponding magnetron arrangement (b).
Figure 10:
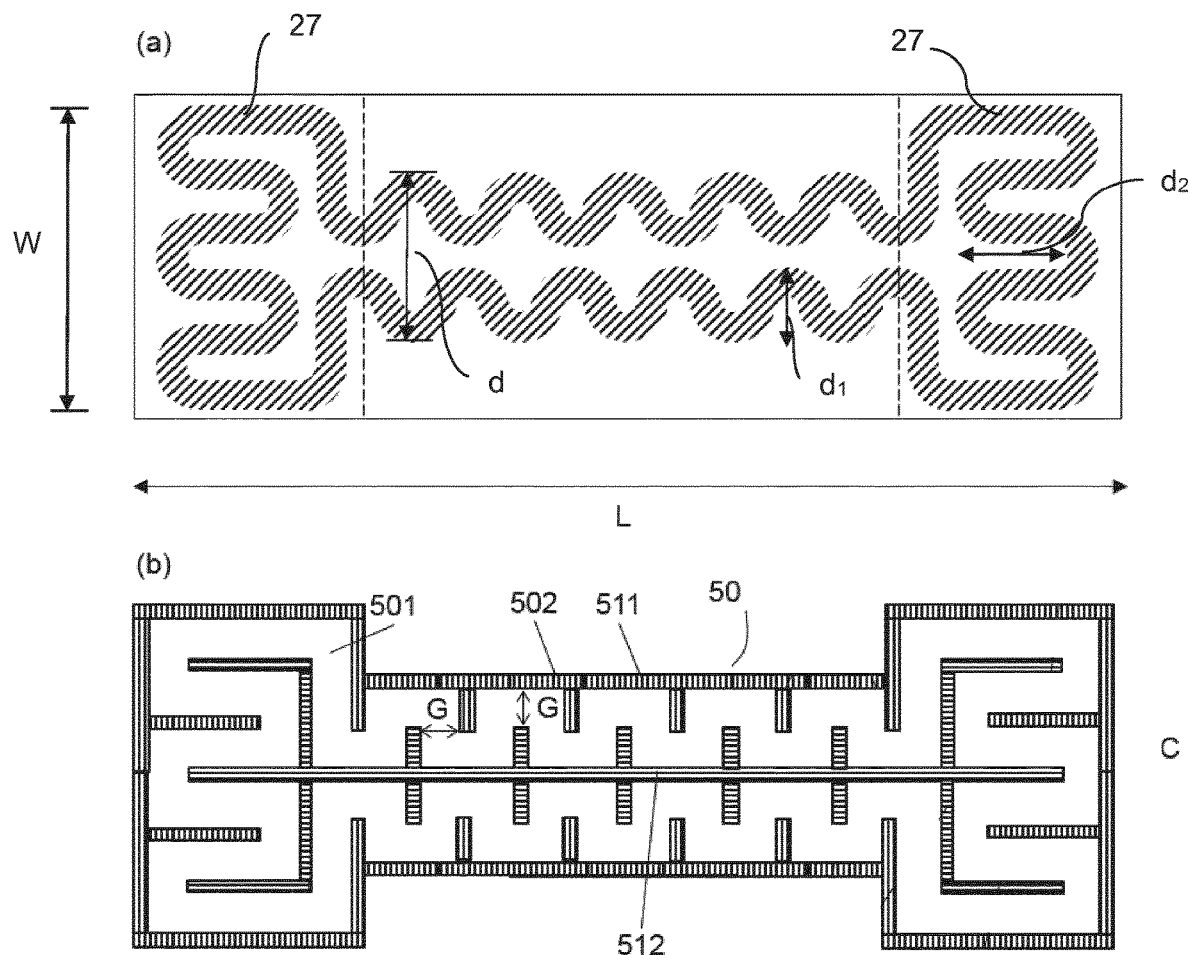

Prior to discussing the embodiments shown in FIGS. 5, 7, 8, 9 and 10 some general embodiments are discussed in the following: There are embodiments of the magnetron sputtering source wherein the shape of the loop sections comprises one or combinations of the following basic shapes; rectangular, triangular, rhombic circular, oval elliptical, which result in a double T-shaped primary geometry of the erosion zone. All of these and other suitable loop sections allow for a widened end zone to cover the extended width at these zones. The geometry can also be selected or arranged in line with the geometry of a substrate to be coated.

It is also possible that the two end zones of the double T-shaped primary geometry are designed differently. E.g. that one end zone has a triangular basic shape whereas the opposite end zone has a circular shape. This might be beneficial for the coating of asymmetric targets.

There are embodiments wherein the parallel tracks in the middle section comprise two straight erosion sections. This allows for an even distribution of the flux of ions onto the target surface due to the parallel and straight magnetic field tunnel in this area.

According to a further embodiment a sputtering magnetron source is provided wherein at least one of the middle section and the loop section comprise a secondary meander-type geometry along the primary geometry. Such a meander-type secondary geometry allows for a more effective use of the target material.

According to a further embodiment a first meander direction in the middle section is different from a second meander directions in the end view section. This approach exhibits more flexibility in adjusting the length of the end zones.

According to a further embodiment a first meander amplitude of the secondary meander type geometry in the middle section is different (smaller) from a second meander amplitude (larger) of the secondary meander type geometry in the loop section. The first meander amplitude may gradually change into the second meander amplitude through at least one meander having a meander amplitude which is larger than the first meander amplitude and smaller than the second meander amplitude.

According to another embodiment the target surface is formed as an elongated plate arrangement and comprises two rectangular end zones or end sections with a rectangular center zone in between, wherein the end zones are wider than the center zone. This saves material during production of the sputtering sources.

Even more flexibility can be achieved in an embodiment wherein the end zones and the center zones are mounted separately on a back plate.

In a further embodiment the inner and outer magnet assemblies are designed and arranged to keep and erosion depth of the erosion zone equal along the erosion zone. This allows for an even consumption of the source material during the coating process.

For all embodiments of the present invention, a magnet yoke at the backside of the magnet assembly is preferentially used but not further discussed here as the person skilled in the art knows how to implement such a magnet yoke according to the present invention.

For all embodiments the magnetic field on the target surface is usually created by a flat array of rectangular shaped permanent magnets. This array is located behind the sputtering target, meaning in the direction not facing the plasma during deposition. The permanent magnets are always arranged in an array corresponding to the different embodiments, in order to achieve a "double T-shaped" racetrack on the target surface. The magnetic field lines leave the surface of the first magnets of one polarity and enter the surface of the magnets of opposite polarity in the next vicinity of the first magnets. Between the first and second magnets of opposite polarity, the magnetic field lines are parallel or nearly parallel to the target surface over a certain width. Instead of using different sized permanent magnets, stacks of smaller equally shaped magnets can be used to adapt the desired size of the magnet shapes generating the magnetic field for the magnetron.

For all embodiments the length extension of the end zones 70 is at maximum 30% of the total target length. The transition of the magnet assembly forming the "double T-shape" can be stepwise or gradual from the wider end zones 70 towards the narrower center zone 60.

For applying the inventive magnetron design at the backside of rectangular targets, it is beneficial in terms of mechanical stability (e.g. involving cooling water pressure on the backside of a target) to maintain an overall rectangular target shape, although it will be shown that the center portion of the target may be fully used up under certain conditions. For target materials bonded on to a backing plate, the target material can be tiled into three parts, one narrower center zone part and two wider end zone parts.

Alternatively, for an already existing target with given dimensions (length and width), the width of the end zones 70 do not have to be expanded in width, but the width of the magnet assembly corresponding to the center zone can be narrowed to achieve the same ratio between the total coating vapor flux in the end zones and the center zone for the substrates passing the sputtering source. This results in a "double-T-shaped" erosion zone on the target and enhanced coating vapor material flux only in the end zones.

In a first embodiment of the present invention, a standard rectangular magnetron sputtering source can be adapted in the inventive manner to exhibit an erosion zone 20 forming a racetrack consisting of essentially two straight erosion sections 26 in the center zone 6 and a curved racetrack in the end zones 7 forming loop sections 27 with extended width W of the erosion end zones. FIG. 5a shows the shape of a racetrack 20 of a full target for an accordingly "adapted" magnetron sputtering source. FIG. 5b shows a schematic arrangement of the permanent magnets behind the target to create such a racetrack "double-T-shape" on the target. The inner 512 and outer 511, 501, 502, 503 magnets of the assembly exhibit opposite polarity. FIG. 5c shows a corresponding way to minimize the amount of target material by adapting the target shape according to the "double-T-shape" of the magnetron assembly by using wider end zones 51, 53 and a narrower center zone 52 in between. End zones 51, 53 and the center zone 52 are of rectangular shape. They can be arranged separately (FIG. 5c) or integrally (FIG. 5a). End zones 7 and center zone 6 can also be designed of the same width and are integrally forming a target 5 (FIG. 5a) in some embodiments. The target material can be bonded on a back plate to fit in e.g. an existing sputter source and/or being adaptable to cooling means of existing sputter deposition plants.

Another example of this embodiment of the invention is depicted in FIGS. 7a) to 7b). The racetrack is transitioning from the wider end loop sections 27 to the narrower middle section with two parallel tracks 26 with respect to the length dimension of the target to achieve the "double T-shaped" racetrack 20. The loop sections 27 in the end zones 7, 53, are connected to the racetrack 20 in the center zone 6, 52 by a straight path 28 being tilted with respect to the length dimension of the target 5, thereby forming a gradual transition of the wider loop sections 27, 28 in the end zones 7, 51, 53 towards the parallel tracks 26 in the center zone 6, 52. For this shape of the racetrack (erosion zone 20), the length of the end zones is elongated. The coating uniformity can thus be further improved by the choice of the length of this transition path 28. FIG. 7b shows a permanent magnet configuration with inner 512 and outer magnets 511, that results in a racetrack shape as shown in FIG. 7a. However, the total erosion material vapor flux forming the end zones cannot arbitrarily be enhanced for given length and width dimensions of the target, since the length of racetrack 20 on the target does not further increase.

The inventive concept of using wider end zones and a narrower center zone is especially applicable for improving the coating thickness distribution of already known meander type racetrack sputtering magnetron sources, such as the sputtering source of EP242826A2.

In another embodiment, the present invention can be realized by e.g. reducing the meander amplitude Ma60 in the center zone 60 without changing the meander period length of the center zone 60 and end zones 70, referred to as Mp60 and Mp70, respectively (see FIG. 8a). This can be achieved by reducing the length of the permanent magnets perpendicularly extending from both sides from the center line of magnets and range into the center zone from the line magnets on both side lines, which make up the "frame" of opposite polarity towards the center line magnets. FIG. 8b schematically shows an arrangement of permanent magnets behind the sputtering target that creates the shape of the racetrack as shown in FIG. 8a. In this example, the end zone 70 exhibits of two meander periods with a larger amplitude, Ma70, than in the center zone 60, resulting in a widening of the end zones 70 in width direction of the target.

Since only a discrete number of periods can be accommodated in these end zones, better adjustment of the effective coating vapor flux from these end zones can be achieved by e.g. a two-step transition from the narrower meander amplitude in the center zone Ma60 to a wider amplitude over the end zones Ma70. A gradual transition of the meander amplitude Ma from the center zone 60 of the target towards the end zones 70 is obtained by including more meander periods, whereby the largest meander amplitude Ma-max is located in the outermost region of the target. FIG. 9a shows a racetrack shape with a gradual change in meander amplitude towards the ends at the full length of the target, FIG. 9b schematically shows a corresponding arrangement of the permanent magnets generating such a racetrack shape on the target. The expert in the field knows how to adjust the magnet arrangement according to the findings of this invention in order to improve the racetrack shape and corresponding coating thickness distribution.

In another embodiment of the present invention, the meander amplitude in the end zones Ma70 is extended in length direction of the target and is longer than the meander amplitudes of the center zone Ma60, extending in width direction. This situation is exemplarily depicted in FIG. 10a, where the end zones 70 exhibit again the "double-T-shaped" racetrack. The sputtering zone is also in this case effectively broadened in width direction. This approach exhibits more flexibility in adjusting the length of the end zones. The meander amplitude Ma is thus an effective means for 'tuning' or optimizing the coating vapor flux rate from the target end zone 70 with respect to the center zone 60. FIG. 10b schematically shows an arrangement of the permanent magnets behind the sputtering target, correlating with the above mentioned findings.

In another embodiment of the present invention, the length of the magnets with same polarity have to be chosen in order to realize a constant meander period Mp throughout the whole magnetron assembly. The length of the magnets may be adjusted by using smaller magnets with the same cross section and stacking those to achieve the desired length.

The length of the center zone 60 and consequently the length of both end zones 70 are parameters which have to be optimized for the specific geometry of the coating system. An important parameter is the distance of the parts from the target surface when those pass the sputtering material vapor flux from the target (target-to-substrate distance). In a typical example with a target length of 90 cm, a target width of 28 cm and parts rotating on a spindle with a minimum distance of the part surface from the target of 14 cm, the length of the end zones may be in the range of 10-25 cm, leaving a center zone length of 40-70 cm. The choice of the meander period primarily depends to the distance of the permanent magnets from the target surface. For a typical target with thickness of 14 mm, the water cooling means behind the target may require another 12 mm, resulting on a total distance of 26 mm of the permanent magnet front surfaces from the erosion racetrack surface on the target. The magnet arrangement with oppositely poled permanent magnets requires that the separation of the permanent magnets must be of similar size as the distance from the target surface in order to obtain magnetic field strength in the racetrack on the target surface that is high enough to achieve sputter coating rates in a coating system as depicted in FIG. 4. Given this fact, a reasonable minimum meander period length must be in the order of twice the distance of the permanent magnets from the target surface. Following the example above, the minimum meander period would be on the order of at least 50 mm.

All above presented examples for straight and/or meander racetrack type magnetron sputtering sources and their possible combinations have in common that the arrangements of the permanent magnets is essentially not changing the local strength of the magnetic field parallel to the surface plane of the target in the racetrack region, resulting in an approximately equal erosion rate in the racetrack both in the center 60 and the end zones 70. As a consequence, both, an improved stability of the coating uniformity and erosion uniformity is achieved over the utilization time of the targets.

This latter performance quality is especially important for sputtering sources used in automated in-line coating systems that cannot easily be accessed for corrective measures concerning coating uniformity, like adjusting shadowing masks, which results in unproductive interruption system utilization.

Reducing the effective coating vapor flux in the center zone of the sputtering source by narrowing the racetrack erosion zone results in an apparently lower overall coating rate for a specific sputtering current applied to the target. Since the applied sputtering current is the sum of all racetrack areas on the target surface, more of the total sputtering current flux (or power flux) is shifted to the end zones at the expense of sputtering current flux in the center zone. As long as the sputtering sources are not operated at the cooling limit of the target, the total sputtering power (or current) can accordingly be increased to compensate for the lower overall coating rate, assuming the power supply used is also not running at its power limit.

Reducing the coating vapor flux from the center zones by limiting the erosion racetrack width or the meander amplitude can be viewed as a reduction of the target material utilization in this center zone, since no longer the full width of the rectangular target is made accessible to erosion for vapor flux generation. As a result, the overall material utilization of the target material is reduced for such a magnetron sputtering source. A possible way to overcome the drawback is using target where the target material surface tiled into three segments. The three segments correspond to a center zone 6; 60 and two end zones 7; 70, which are bonded on a backing plate. The width of the central target material zone 60 can be reduced, covering only the width of the racetracks 26 in this region. For full targets of rectangular shape, the utilization appears to become somewhat worse compared to a non-uniformity optimized sputtering source. However, given the requirement of narrow range uniformity is required for coatings to be produced, more uniform coated area can be obtained with an optimized sputtering source, resulting in an overall better efficiency in material usage. Additionally, since the total coating material usage with full targets is always lower than with bonded target materials on backing plates, full targets are usually only used for relatively inexpensive materials where the material usage factor is a minor operating cost factor, especially compared to scrap cost for parts that do not pass uniformity requirements.

In principle any variation of meander amplitudes in width and/or length direction of the target or combination of different embodiments of this invention falls in the focus of the present invention as long as the following criteria are fulfilled where applicable:

only permanent magnets of equal strength per unit length and polarization perpendicular to its length dimension are used for assembly of the inventive magnetron sputtering source;

the magnets of opposite polarity are assembled at essentially equal distance in order to realize an equivalent perpendicular cross section profile and strength distribution of the magnetic field in the racetrack on the target surface;

the magnet assembly results in a magnetic field that extends through the target, enclosing an overall "double-T-shape", that causes the localization of erosion in a corresponding "double-T-shaped" racetrack on the target;

the meander period Mp between the adjacent magnets of equal polarity is constant in the center zone 60, as well as the end zone 70;

the meander amplitude Ma may be varied between a lower limit of the meander amplitude Ma60 in the center zone 60 and an upper limit Ma-max in the end zone 70, where the lower limit of the amplitude Ma60 may be zero (i.e. a straight line shaped racetrack), whereas the upper limit Ma-max may be half of the width of the target minus the width of the racetrack itself (racetracks cannot overlap);

the maximum meander amplitude Ma-max (being the longest meander amplitude of the magnetron assembly) is located in the end zone 70.

An inventive used plate-shaped material substrate of a magnetron sputtering source was disclosed, having a second surface or front side wherein the second surface comprises a closed erosion zone as a trench with central trench line along which the depth of erosion is maximum and at each point of the central trench line defines the local trench depth and the trench edges of the erosion trench are defined by those lines where the erosion depth is 10% of the central erosion depth wherein the trench width is defined as the distance of the trench edges arranged around the central trench line wherein the local trench depth along the entire trench line is substantially equal and the central trench line extends in a plane spanned by an x-direction and a vertical y-direction plane wherein each point of the central trench line can be formed in the y-direction infinite stripe in the plane whose width in the x-direction corresponds to the width of the trench and the point lies on the center line of the stripe.

The inventive substrate is characterized in that the sum of the lengths of the pieces of central trench lines running in a strip is substantially the same for all the stripes so defined at any point of the central trench line.

Further embodiments and variations of the present invention are obvious for someone skilled in the art within the scope of the claims.

1 sputtering source
2 substrate
3a rotating spindle
4 coating vapor
5 target
6 center portion/center zone
7 end zone
10 erosion zone/racetrack
11 loop section/loop-shaped racetrack section
12 erosion section/tracks
13 loop section/loop-shaped racetrack section
20 erosion zone/racetrack
26 erosion section/tracks
27 loop section/loop-shaped racetrack section
28 (transition) path
50 magnetron arrangement
51 end zone
52 center zone
53 end zone
60 center zone
70 end zone
100 coating system arrangement
111 inner magnet assembly
112 outer magnet assembly
501 outer magnet
502 outer magnet
503 outer magnet
511 outer magnet (assembly)
512 inner magnet (assembly)
C center line
d distance
d1 first meander direction
d2 second meander direction
Ma meander amplitude
Ma60 meander amplitude
Ma70 meander amplitude
Ma-max maximum meander amplitude
Mp meander period
Mp60 meander period length
Mp70 meander period length
width

The invention claimed is:

1. A Magnetron sputtering source for coating of a substrate, the sputtering source comprising:
a target having a target surface at a front side of the target, wherein the target is formed as an elongated plate arrangement and consists of two rectangular end zones with a rectangular center zone in between the two rectangular end zones, wherein the end zones are wider than the center zone,
a magnetron arrangement at a backside of the target for creating a magnetic field near the target surface, to define a loop shaped erosion zone at the target surface between an inner magnet assembly and an outer magnet assembly,
wherein the erosion zone comprises a middle section with two parallel tracks having a distance and two curved end loop sections each of which connects adjoining ends of the parallel tracks and has a loop width in the direction of the distance which is greater than the distance resulting in a double-T-shaped primary geometry of the erosion zone to provide an increased coating material flux from the end loop sections to the substrate.

2. The Magnetron sputtering source according to claim 1, wherein the shape of the end loop sections comprises one or combinations of the following basic shapes: rectangular, triangular, rhombic, circular, oval, elliptical.

3. The Magnetron sputtering source according to claim 1, wherein the parallel tracks comprise two straight erosion sections.

4. The Magnetron sputtering source according to claim 1, wherein at least one of the middle section and the end loop sections comprise a secondary meander type geometry along the primary geometry.

5. The Magnetron sputtering source according to claim 4, wherein a first meander amplitude in the middle section is smaller than a second meander amplitude in the end loop sections.

6. The Magnetron sputtering source according to claim 5, wherein the first meander amplitude gradually changes to the second meander amplitude through at least one meander having a meander amplitude which is larger than the first meander amplitude and smaller than the second meander amplitude.

7. The Magnetron sputtering source according to claim 4, wherein a first meander direction in the middle section is different from a second meander direction in the end loop sections.

8. The Magnetron sputtering source according to claim 1, wherein the end zones and the center zone are mounted separately on a back plate.

9. The Magnetron sputtering source according to claim 1, wherein the inner and outer magnet assemblies are designed and arranged to keep an erosion depth of the erosion zone equal along the erosion zone.

10. A Coating system arrangement comprising a magnetron sputtering source according to claim 1.

* * * * *